United States Patent [19]

Gay

[11] Patent Number: 4,638,111

[45] Date of Patent: Jan. 20, 1987

[54] THIN FILM SOLAR CELL MODULE

[75] Inventor: Robert R. Gay, Granada Hills, Calif.

[73] Assignee: Atlantic Richfield Company, Los Angeles, Calif.

[21] Appl. No.: 741,084

[22] Filed: Jun. 4, 1985

[51] Int. Cl.⁴ .................... H01L 25/08; H01L 31/06
[52] U.S. Cl. .................................. 136/249; 136/258; 136/265; 357/30
[58] Field of Search ........ 136/249 TJ, 265, 258 AM; 357/30

[56] References Cited

U.S. PATENT DOCUMENTS 4,295,002 10/1981 Chappell et al. .................... 136/244
4,461,922 7/1984 Gay et al. ....................... 136/249 TJ Primary Examiner—Aaron Weisstoch
Attorney, Agent, or Firm—Nilsson, Robbins, Dalgarn, Berliner, Carson & Wurst

[57] ABSTRACT

A solar cell module contains a thin film silicon (TFS) semiconductor panel positioned above a copper indium dieselenide (CIS) semiconductor panel. The combination of the TFS panel and the CIS panel is effective to utilize a substantial proportion of the light energy of the solar spectrum.

14 Claims, 6 Drawing Figures

THIN FILM SOLAR CELL MODULE

BACKGROUND OF THE INVENTION

1. Field Of The Invention

This invention relates to photoconductive devices such as solar cells for converting light into electrical energy and more particularly to thin film solar cell modules.

As used throughout this specification and the claims, the following terms have the following meanings:

"Solar Cell" or "cell", an individual discrete member having a junction therein and capable of directly converting photons to electrical energy;

"Thin film solar cell", a solar cell fabricated from microcrystalline, amorphous, or compound semiconductors, or semiconductor material other than single crystalline semiconductor material deposited in situ upon a substrate;

"Panel", an array or group of solar cells interconnected to provide an output of electrical energy;

"Module", one or more panels confined within an appropriate housing and capable of being placed in long term service for production of electrical energy;

"Array", depending upon the context, a group of solar cells forming a panel or group of panels positioned to receive photons for direct conversion to electrical energy;

"Spectral response", sensitivity to a predetermined portion of the light spectrum less than the whole thereof.

2. The Prior Art

It has long been desirable to capture as much of the sun's spectrum as possible to convert it directly into electrical energy through the utilization of solar cells. Conventional single crystal solar cells appear to be rapidly approaching the ultimate intrinsic limits of their conversion efficiency. As a result, other types of solar cells are being constructed, such as those made from gallium arsenide and other similar materials. While such materials may have a higher efficiency of conversion than single crystal silicon, there is a limit to the ultimate efficiency which can be expected.

To increase the collection efficiency, consideration has been given to cascading solar cells, as is discussed in Salahm Bedair, Sunil B. Phatak, and John R. Hauser, *IEEE Transactions on Electron Devices*, ED-27, No. 4: 822-831 (April, 1980). As is therein disclosed, one of the approaches to improve efficiency makes use of two or more cells to more efficiently utilize the solar spectrum. A first approach utilizing such plurality of cells is that of spectrum splitting. That is, the solar spectrum is split into two or more parts by the use of filters and as a result a narrower band of photon energies is incident on each individual cell. As a consequence, each cell must respond to a narrower range of photon energies and each of the cells can then be optimized at a higher efficiency than can one single cell for the entire solar spectrum. One experimental apparatus used a silicon single crystal cell for the low energy photons and an aluminum gallium arsenide (AlGaAs) cell for the high energy photons.

Another approach is to connect two individual solar cells in optical and electrical series. In this approach, the wide bandgap cell is located above the narrow bandgap cell. The high energy photons are then absorbed in the wide bandgap top cell while the low energy photons, i.e., those below the band gap of the top cell, pass to the bottom cell for absorption. The cascaded cells were formed by utilizing an aluminum gallium arsenide/gallium arsenide monolithic cell structure with a heavily doped, very thin tunneling interface layer having a bandgap as large or larger than that of the top cell.

It will be readily recognized that the spectrum splitting concept requires mirrors, filters, and two distinct solar cells. In addition, two distinct packages housing those solar cells and the spectrum splitting device are required. Those skilled in the art will readily recognize that the utilization of such a concept for commercial applications is not cost effective as compared to the state of the art solar cells.

The cascading of solar cells by optical and electrical series connection through the utilization of a thin highly doped tunneling interface requires matching of short circuit currents in order to achieve proper operation. This matching of short circuit currents becomes impossible when the cell is exposed to ambient sunlight, simply because the frequencies of the ambient light on earth change throughout the day as the sun moves across the sky. Thus it will be recognized by those skilled in the art that short circuit current matching cannot be accomplished except for one frequency of the spectrum or one particular spectrum of incident light. Furthermore, if single crystal structures are to be used for the cascaded cells as disclosed in the prior art, the interface connections require lattice matching to obtain the appropriate tunneling through the interface. Such has proven to be ineffective.

In each of the instances in the prior art mentioned above, individual solar cells have been dealt with as opposed to interconnected arrays of such cells forming a complete panel of solar cells.

U.S. Pat. No. 4,461,922 to Charles F. Gay, V.K. Kapur, and James H. Wilson, the disclosure of which is incorporated herein by reference, describes a solar cell module in which individual panels of solar cells are stacked one on top of another and arranged so that incident light passes through each of the arrays of cells in each panel, thereby striking the one below it. In this patent, the solar cells in each panel are selected to have a predetermined and different spectral response and thus be responsive to different frequencies of light. According to the patentees, each of the panels may independently be constructed from thin film silicon hydrogen alloys, single crystal, or compound semiconductors. Although this patent describes stacking solar modules in order to improve the efficiency thereof, there has been a need to maximize the utilization of light energy and to thereby enhance the efficiency of such stacked modules.

It is accordingly an object of the present invention to provide a photoconductive device in which the utilization of light energy is maximized.

Another object of this invention is to enhance the efficiency of photoconductive devices.

Other objects and advantages of the present invention will become apparent from the following detailed description.

SUMMARY OF THE INVENTION

The thin film solar cell module of the present invention utilizes a pair of thin film solar cell panels which have different spectral responses. One panel contains an array of solar cells consisting of a thin film silicon alloy (TFS) semiconductor sandwiched between a transparent conductive layer comprised of zinc oxide and another transparent conductive layer, which is deposited upon a suitable transparent insulating substrate. The thin film silicon alloy may be silicon-hydrogen or tandem stacks of silicon-hydrogen with silicon-garmanium-hydrogen. Facing the zinc oxide transparent conductive layer of the first panel and positioned below the first panel is another panel which contains an array of copper indium diselenide (CIS) solar cells consisting of an insulating substrate, a conductive metal layer deposited thereon, a CIS semiconductor deposited upon the metal layer and a zinc oxide semiconductor deposited upon the CIS layer. The zinc oxide semiconductor contains a first, relatively thin layer of high resistivity zinc oxide and a second, relatively thick layer of low resistivity zinc oxide. The two photoconductive panels are separated by means of a transparent insulating layer.

DETAILED DESCRIPTION

Figure 1:
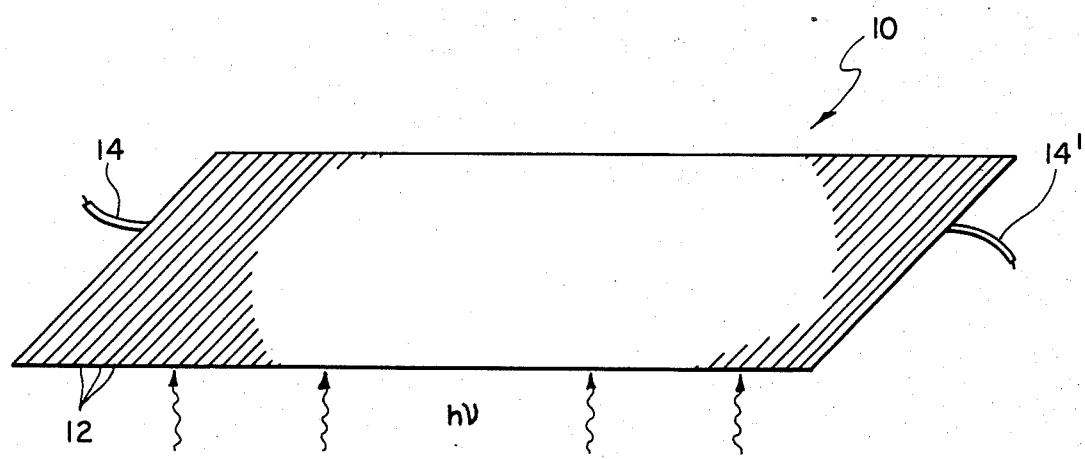
FIG. 1 is a perspective view of a monolithic solar panel used in the thin film solar cell module of the present invention.

The thin film solar cell module of the present invention comprises a plurality of thin film solar cell panels having varying spectral response. A monolithic solar cell panel is shown generally at 10 in FIG. 1.

The panel defines a plurality of elongated solar cells 12 connected electrically in series between a pair of external leads 14—14'. The cells are shaped as narrow strips connected along opposite longitudinal edges to minimize series resistance losses. Connection between cells is accomplished directly through an unpatterned active film of the solar panel, without interrupting the film. Current generated by the cells in response to incident light (hv) travels a very short distance within each cell electrode before passing to the opposite electrode of an adjacent cell. The solar cell module of the present invention is particularly significant in that a plurality of independent solar cell panels, each of which could be made separately operable are fabricated utilizing the desired materials responsive to predetermined different portions of the solar spectrum. The solar cell panels may be fabricated separately in order to utilize the particular techniques which are most proficient in the fabrication of the particular material. After the completed fabrication of the individual panels, they are physically stacked one upon the other with an appropriate transparent interface therebetween which functions to allow photons to pass therethrough. In this manner, by tailoring the spectral response of the individual solar cell panels, they can be made responsive to different portions of the solar spectrum and effectively tailored to achieve maximum efficiency of collection with respect to those predetermined portions.

In addition to the foregoing, this fabrication technique permits utilization of portions of the structure as the housing material for the completed solar cell module. These fabrication techniques result in a higher efficiency module which may be tailored to fit a desired application, providing higher collection efficiencies than heretofore possible at a reasonable cost.

Figure 2:
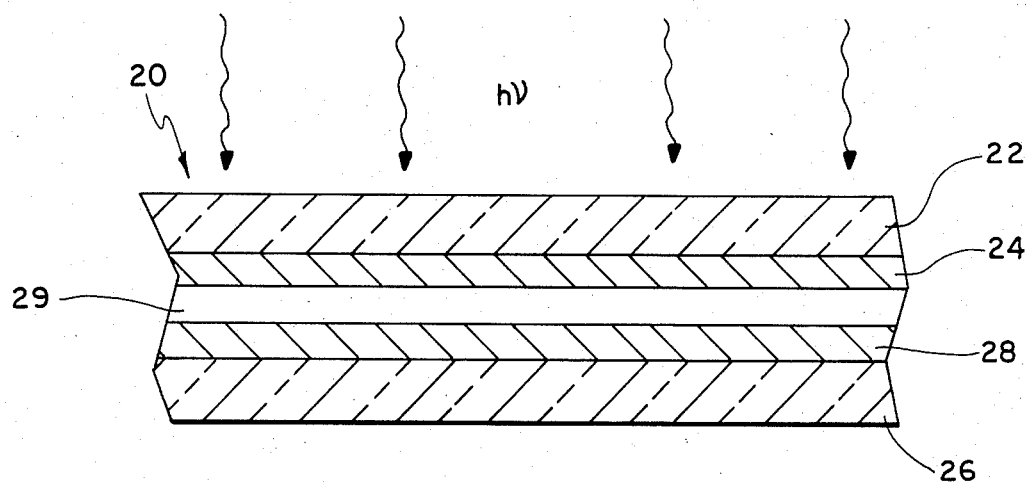
FIG. 2 is an enlarged, fragmentary, cross-sectional schematic view of a thin film solar cell module according to the present invention.

As is shown in FIG. 2, a thin film solar cell module 20 consists of an first insulating superstrate 22, such as glass or transparent plastic, a TFS semiconductor 24, a CIS semiconductor 28, an insulating substrate 26 and a transparent dielectric layer 29 which may be a gas, liquid or solid. In a preferred embodiment, layer 29 is a pottant layer which may be made of any suitable-transparent material, such as silicone, polyvinyl butyral (PVB), or ethylene vinyl acetate (EVA). PVB is a transparent thermoplastic pottant material which has been used in a number of prior solar panels. EVA is a thermosetting material which has also been used as an encapsulant. A particular formulation of EVA which has been found to be particularly attractive is the following: (1) 10 parts of Dupont's Elva-150 ethylene vinyl acetate formulation (2) 0.2 part of Uniroyal's Naugard anti-oxidant; and (3) 0.5 part of Pennwalt's Lupersol 101 peroxide cross-linking agent. Layer 29 may also be air. It may also be a three layer structure consisting of EVA/polyester/EVA, where the polyester layer has been added to guarantee electrical isolation of the two solar cell panels.

Figure 3:
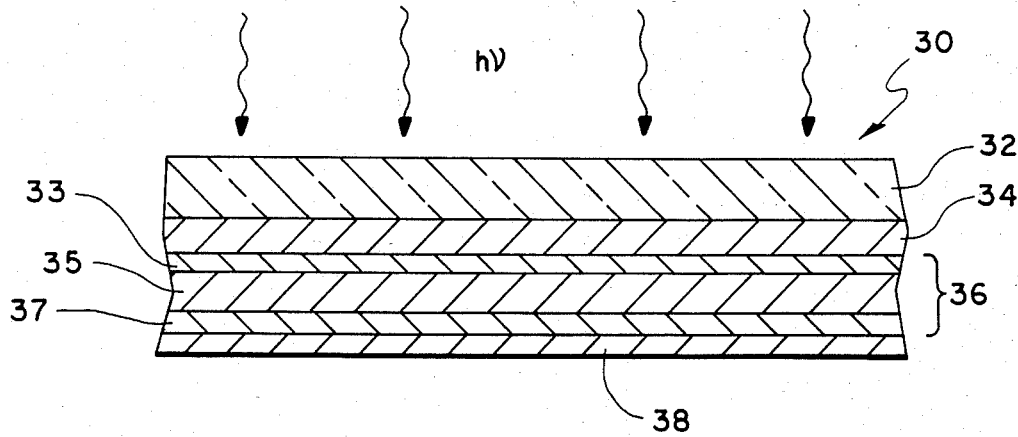
FIG. 3 is an enlarged, fragmentary, cross-sectional schematic view of a TFS solar cell panel used in the module of this invention.

The TFS solar cell panel is illustrated in more detail in FIG. 3. As shown therein, the TFS solar cell panel 30 contains a transparent superstrate 32, a transparent conductive oxide layer 34, which may be, for example tin oxide (TO), indium tin oxide (ITO), or zinc oxide, a TFS semiconductor 36 and another transparent conductive oxide layer 38, which is preferably zinc oxide. The superstrate 32 can be any transparent insulating material such as glass or any suitable transparent plastic material. Glass is preferred because of its strength, tolerance to high processing temperatures, and desirable optical properties.

The TFS semiconductor 36 may comprise a P-layer, an I-layer, and an N-layer, known as a P-I-N Type semiconductor, as illustrated, a P-I-N-P-I-N type stack, or a P-layer and an N-layer, or may be a single layer in which a concentration gradient of dopant results in contributing P character and N character to various parts of the layer.

In the preferred embodiment shown in FIG. 3, TFS semiconductor 36 is shown comprising P-layer 33, I-layer 35, and N-layer 37. P-layer 33 comprises boron-doped TFS which, for example, may be a hydrogenated silicon-carbon alloy doped with boron. In this preferred embodiment, the P-layer can contain about 60 to 70 atomic percent silicon, about 20 atomic percent carbon, about 10 to 20 atomic percent hydrogen and a fraction of an atomic percent boron as a dopant. The thickness of the P-layer can vary between about 70 and 300 angstroms. I-layer 35 is composed of a silicon-hydrogen alloy which can contain about 85 to 95 atomic percent silicon and about 5 to 15 atomic percent hydrogen. The I-layer can be about 1500 to 7500 angstroms in thickness. N-layer 37 contains silicon-hydrogen alloy containing phosphorous. This layer can contain about 85 to 95 atomic percent silicon, about 5 to 15 atomic percent hydrogen, and a fraction of an atomic percent to a few atomic percent phosphorous. The thickness of the N-layer can be between about 70 and 800 angstroms.

Transparent conductive layer 38 is zinc oxide containing certain additives. Such additives as hydrogen or a group III element such as boron, aluminum, gallium, indium, and thallium can be used, depending upon the resistivity and thermal properties desired. For example, zinc oxide containing hydrogen is less thermally stable than is zinc oxide containing aluminum, while zinc oxide containing aluminum has a somewhat higher resistivity than does zinc oxide containing hydrogen. Trace amounts of the additives are used, as will be pointed out more in detail below. The thickness of the transparent conductive layer can be about 100 to 60,000 angstroms with about 2,000 to 15,000 angstroms being preferred.

The various photoconductive and other layers can be deposited upon the substrate by means of a glow discharge technique, sputtering, or by chemical vapor deposition.

The P-layer, for example, can be readily formed by introducing a mixture of silane, methane, and diborane into a glow discharge chamber in proportions to give the desired P-layer composition. The deposition occurs at a pressure of about 0.1–1.0 torr and at a temperature of about 150°–300° C. Deposition is continued for a sufficient period of time to deposit a layer of the desired thickness. A P-layer having a band-gap between bout 1.9 and 2.0 eV, a dark conductivity of about $10^{-6}$ reciprocal ohm-centimeters, and a light conductivity of about $10^{-5}$ reciprocal ohm-centimeters can be obtained in this manner. After the P-layer is deposited the glow discharge chamber is purged to avoid any contamination of the I-layer, which is deposited next.

Deposition of the I-layer is then accomplished by evacuating the chamber and back-filling with pure silane gas. Deposition then proceeds at a pressure of about 0.1–1.0 torr and a temperature of about 150°–300° C. Following deposition of the I-layer the chamber is pumped down and back-filled for deposition of the N-layer.

In order to deposit the desired silicon and phosphorous composition comprising the N-layer, silane and a mixture of phosphine in an inert gas are passed through the chamber at a pressure of about 0.1–1.0 torr and a temperature of about 150°–300° C.

Transparent conductive layer 38 is preferably a wide band-gap zinc oxide layer which is transparent at wavelengths in the visible range from 300 to 1300 nm. Zinc oxide can be readily deposited upon the photoconductor by sputtering to provide a transparent layer having a thickness in the range of about 100–60,000 angstroms and preferably about 2,000–15,000 angstroms at a pressure in the range of about 5 to 20 millitorr and at a temperature in the range of about 25° to 250° C. Where hydrogen inclusion is desired the hydrogen pressure should be in the range of about 0.01 to 0.08 millitorr, with 0.04 millitorr preferred. Where aluminum inclusion is desired the aluminum content should be in the range of about 0.2–10 percent by weight with about 0.5–5 weight percent preferred. The resulting transparent conductive layer is highly conductive, having a resistivity in the range of about $10^{-4}$ to $10^{-2}$ ohm-centimeter. Where the zinc oxide contains hydrogen, the resulting ZnO(H) layer, which can be deposited at a temperature of about 25°–90° C., has been found to have a resistivity in the range of about $6 \times 10^{-4}$ to $1 \times 10^{-3}$ ohm-centimeter. A zinc oxide layer containing aluminum can be deposited at somewhat higher temperatures, as well as at room temperature, depending upon the method used. The ZnO(Al) layer has a resistivity of about $8 \times 10^{-4}$ to $1 \times 10^{-3}$ ohm-centimeter. It is also possible to include both hydrogen and aluminum in the zinc oxide. Hydrogen pressures in the range of about 0.01 to 0.08 millitorr and an aluminum content in the range of about 0.20 to 10 weight percent are suitable. A hydrogen pressure of about 0.04 millitorr and an aluminum content of about 0.5 to 5 weight percent are preferred. The ZnO(H,Al) layer displays a resistivity in the range of about $3 \times 10^{-4}$ to $6 \times 10^{-4}$ ohm-centimeter.

The ZnO(H) layer is less temperature stable than the ZnO(Al) layer. The ZnO(H,Al) layer, which can be deposited at ambient temperatures, has been found to remain stable at temperatures of up to about 250° C. in air.

Especially preferred is depositing the zinc oxide film by chemical vapor deposition.

The process is conducted by introducing an organozinc compound, an oxidant, and any desired volatile additive into a chamber containing the desired substrate, which is heated to a temperature within the range of about 60° to 350° C., preferably 100°–200° C., and most preferably to a temperature of about 150° C. By heating the substrate, deposition of zinc oxide upon the walls of the chamber is avoided. In addition, deposition takes place only upon those areas of the substrate which are heated, thus making it possible to deposit a zinc oxide layer upon the entire surface of the substrate or only selected portions thereof.

The system for depositing zinc oxide films in accordance with the present invention utilizes a chamber containing a heated table, means for introducing the reactants into the chamber in gaseous form, and a regulated pumping system to provide a dynamic gas flow through the chamber. An organozinc compound and oxidant are carried into the chamber in individual streams of an inert carrier gas. Mixing of the organozinc vapor and oxidant occurs before contact with the heated surface of the substrate in the space between the point of introduction thereof and the heated substrate surface. Reaction between the organozinc compound and oxidant results in decomposition of the organozinc compound to produce zinc oxide, which grows upon the substrate as a thin film, with $CO_2$, CO, and volatile hydrocarbons as possible byproducts of the reaction. The zinc oxide film contains hydrogen and may contain a group III element where a volatile compound of a group III element is also introduced into the deposition chamber. Suitable organozinc compounds include zinc dialkyls having the formula $R_2Zn$, wherein R is an alkyl radical, preferably a lower alkyl radical. Dimethyl zinc, $(CH_3)_2Zn$, and diethyl zinc, $(C_2H_5)_2Zn$, are particularly preferred.

Suitable oxidants include water, oxygen, ozone, hydrogen peroxide, nitric oxide, nitrous oxide, nitrogen dioxide, carbon dioxide, sulfur dioxide and other oxygen-containing gases as well as organic oxygen-containing compounds. Representative of suitable organic oxygen-containing compounds are alcohols having the formula, R—OH; ethers having the formula R—O—R'; aldehydes having the formula

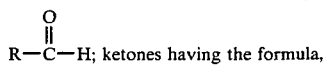
ketones having the formula,

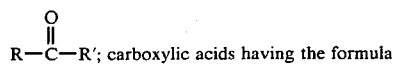
carboxylic acids having the formula

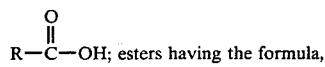
esters having the formula,

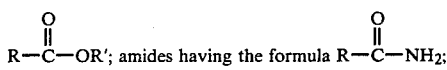
amides having the formula $R-\overset{O}{\underset{\|}{C}}-NH_2$;

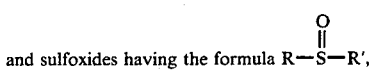
and sulfoxides having the formula $R-\overset{O}{\underset{\|}{S}}-R'$, where R and R' are alkyl, preferably lower alky; to mention but a few of the possible organic oxidants which might be used.

The composition of the gaseous streams can be varied. The organozinc vapor is produced by vaporizing the organozinc compound into the gas stream, for example by bubbling a stream of inert gas through a reservoir of organozinc compound. Other vaporization methods are equally effective. The mole fraction of the organozinc compound in its carrier gas stream can be up to about 0.5. A mole fraction of about 0.2 is especially preferred.

The oxidant is similarly introduced into the deposition chamber by any suitable method. Bubbling an inert gas through a reservoir of deionized water to produce a mixture of inert gas and water vapor, for example, is an effective method for introducing water vapor. The mole fraction of water vapor or other oxidant in its carrier gas stream can be up to about 0.5.

The proportion of oxidant to organozinc compound can be varied depending upon the particular properties of the zinc oxide film desired. In general, an excess of oxidant is desirable. Films deposited using excess organozinc compound have markedly higher resistivities and display poor adhesion to the substrate. A range of about 1-3 moles oxidant per mole of organozinc compound can be used. The flow rates of the mixture of the inert gas and organozinc compound, and the mixture of the inert gas and oxidant can be varied depending upon the particular mole ratios and partial pressures of reactants which are intended to be reacted at the surface of the substrate. For example, where bubblers are used to introduce the reactants, flow rates of the mixture of the inert gas and organozinc compound and inert gas and oxidant should be in the range of about 5 SCCM to 100 SCCM per square foot of deposition surface.

The inert gas used as a carrier for the organozinc vapor and the oxidant can be any inert gas, for example, argon or helium, or any gas which is inert under the conditions prevailing in the deposition chamber, such as nitrogen.

Pressures within the deposition chamber in the range of about 0.1 torr to 2 torr have been found to facilitate the deposition process. Pressures can be varied by control of the reactant gas streams or by means of the regulated pumping system. The hydrogen-containing zinc oxide deposited according to the process of the present invention has been found to have resistivity in the range of about $10^{-4}$ to $10^{-2}$ ohm-centimeter and a light transmission of greater than 90%. The resistivity can be reduced by adding group III elements to the zinc oxide film. For example, aluminum can be introduced by using trimethyl aluminum, $(CH_3)_3Al$. Similarly, boron can be introduced by utilizing diborane, $B_2H_6$. Gallium and indium can also be used as additives. Addition of about 1-4 mole percent of the selected additive or additives based on the organozinc vapor content has been found to be desirable. Addition of about 2 mole percent is preferred. Where boron is to be incorporated into the zinc oxide film, diborane is introduced into the organozinc vapor stream or may be introduced independently into the deposition chamber. Boron-containing zinc oxide layers have been found to have resistivities in the range of about $1.0 \times 10^{-3}$ ohm-centimeter to $2 \times 10^{-3}$ ohm-centimeter.

Deposition rates of about 200 angstroms per minute at 125° C. are readily attainable. Deposition rates are controlled by the deposition temperature and also by the gas flow rates and the partial pressures of reactants. Zinc oxide films can be deposited to any desired thickness by controlling the time and rate of deposition. Typical films are 10,000-20,000 angstroms thick. The polycrystalline zinc oxide formed is found to have an X-ray diffraction corresponding predominantly to (002) orientation with respect to the plane of the substrate.

By means of the process of the present invention, it is thus possible to deposit large areas of zinc oxide and to control the resistivity thereof. In this manner, for example, conductive zinc oxide layers for use in solar cells can be readily deposited. Depending upon the particular additive utilized in the process, it is also possible to produce other zinc oxide layers for use in photoconductive devices and having varying physical and electrical properties.

With all the zinc oxide layers and zinc oxide layers containing hydrogen or a group III element described above, the transmittance of the layer has been found to be over 90 percent with a refractive index of about 2.0.

Figure 4:
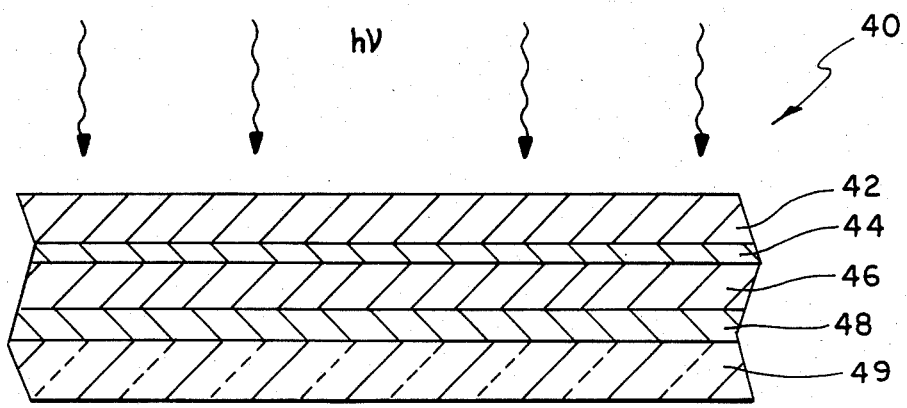
FIG. 4 is an enlarged, fragmentary, cross-sectional schematic view of a CIS solar cell panel used in the module of this invention.

The CIS solar cell panel is illustrated in more detail in FIG. 4. As shown therein, solar cell panel 40 contains a low resistivity zinc oxide layer 42 and a high resistivity zinc oxide layer 44. Low resistivity zinc oxide layer 42 may have a resistivity in the range of about $1 \times 10^{-3}$ to $2 \times 10^{-3}$ ohm-centimeter and a thickness of about 5,000 to 20,000 angstroms. High resistivity zinc oxide layer 44 may have a resistivity of about 0.1 to 0.2 ohm-centimeter and a thickness of about 100 to 2,000 angstroms. The high resistivity zinc oxide layer 44 is essentially pure zinc oxide, while low resistivity zinc oxide layer 42 is zinc oxide containing small amounts of additives effective to provide a zinc oxide material of relatively low resistivity. CIS solar panel 40 also contains a CIS semiconductor 46, a metal layer 48, and a substrate 49. Substrate 49 is any insulator, for example, glass or plastic. Metal layer 48 in the preferred embodiment is molybdenum, which has been deposited upon substrate 49 by sputtering to a thickness of about 2,000 to 20,000 angstroms. Adhesion of this layer to the substrate 49 can be improved by sputtering a thin layer of chromium on to the substrate prior to sputtering the molybdenum.

CIS semiconductor 46, which forms a heterojunction with ZnO layers 44 and 42, is primarily p-type copper indium diselenide having a thickness of about 2,000 to 20,000 angstroms. Various other materials may be alloyed with the CIS layer for various purposes. For example, it is known that aluminum, gallium, tellurium, or sulfur may be included in copper indium diselenide films to adjust bandgaps. Likewise, the precise ratios of copper, indium, and selenium may be adjusted to improve the qualities of the final layer. The CIS layer is formed as follows: copper is first deposited to a film thickness of about 2,000 angstroms on metal layer 48. Thereafter, indium is deposited onto the copper film to a thickness of about 4000 angstroms. These layer thicknesses provide a desired atomic ratio of about 1.0. The copper and indium layers have been deposited both by electrodeposition from aqueous solutions and by sputtering from solid targets. After thus depositing copper and indium by either method, a copper indium diselenide semiconductor layer 46 is formed by "selenization". This process involves heating the substrate to approximately 400° C. in the presence of gas comprising about 3% H$_2$Se diluted in argon for approximately one hour and thereafter annealing the material for an additional two hours at the same temperature.

The preferred method for depositing zinc oxide film on the copper indium diselenide layer is chemical vapor deposition (CVD) or, more specifically low temperature chemical vapor deposition (LTCVD). In this process, the substrate 49 with films 48 and 46 thereon is placed in a vacuum chamber on a heated support. The chamber is then evacuated and substrate temperature is adjusted to about 150° C. and allowed to stabilize for about 20 minutes. To form the high resistivity zinc oxide layer 44 on a substrate having an area of about 1 square foot, reactive gases comprising 8 sccm diethyl zinc, 10 sccm H$_2$O, and 186 sccm of argon were flowed across the substrate at a pressure of 0.86 torr while the initial temperature was maintained. Flow rates of diethyl zinc and H$_2$O were estimated from the flow rates of inert carrier gas streams assuming saturation. For deposition times of from two to six minutes, high resistivity zinc oxide films may be deposited to thicknesses ranging between about 700 and 2000 angstroms. While the resulting ZnO film is referred to herein as pure or essentially pure ZnO, it will be appreciated that the H$_2$O contributes some hydrogen to the material and this probably has some effect on resistivity. When the desired thickness of high resistivity layer 44 has been deposited, deposition of the low resistivity layer of zinc oxide 42 is commenced by simply changing the reactive gas mixture. Layer 42 may be formed for example, from a reactive gas comprising 8 sccm diethyl zinc, 10 sccm H$_2$O, 0.075 sccm B$_2$H$_6$, and 200 sccm argon. A low resistivity layer 42 having a thickness of about 10,000 angstroms can be deposited under these conditions in about 30 minutes process time.

While specific parameters are given above for the LTCVD process, good zinc oxide films can be achieved over a range of conditions. The substrate temperature can be varied from about 60° C. to 350° C. and preferably from about 100° C. to 200° C. Even at the 350° C. level, this is a low temperature process as compared to other methods of depositing transparent conductors and is therefore well suited for use with semiconductors. Vacuum system pressure can be varied from about 0.1 torr to 2 torr. The chamber should, however, be capable of developing high vacuum levels to allow removal of all ambient gases from the chamber before deposition conditions are established. Other zinc dialkyls having the formula R$_2$Zn, where R is alkyl, for example, dimethyl zinc (CH$_3$)$_2$Zn, may be used in place of the diethyl zinc (C$_2$H$_5$)$_2$Zn specified above. Other oxygen sources, such as O$_2$ gas, ozone, hydrogen peroxide, nitric oxide, nitrous oxide, nitrogen dioxide, carbon dioxide, sulfur dioxide, and organic compounds of the formulae R—OH, R—O—R',

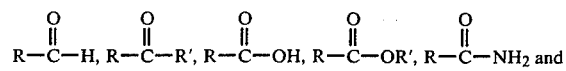

where R and R' are alkyl may be useful in place of the H$_2$O used in the preferred embodiment. Other inert gases, such as helium or nitrogen, could be used in place of argon as a carrier for the organozinc compound and water. The organozinc compound vapor and oxidant may be introduced into the vacuum chamber by bubbling the inert gas through a reservoir of the compound or deionized water or by other suitable means. A mole ratio of water to organozinc compound greater than 1.0 is preferred to provide the proper reaction conditions.

Figure 5:
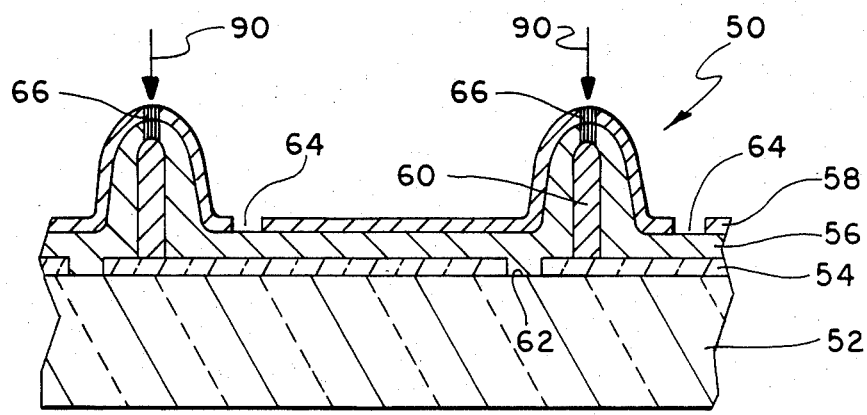
FIG. 5 is an enlarged, fragmentary, cross-sectional schematic view of the TFS solar cell panel illustrated in FIG. 3, showing the construction thereof.

Since it is desirable to fabricate each of the solar cell panels independently and to then combine the panels into a thin film solar cell module the construction of the TFS solar cell panel will first be described followed by the construction of the CIS panel. Referring to FIG. 5 the numeral 50 represents a portion of a TFS solar cell panel in accordance with the present invention. The TFS solar cell panel contains a glass substrate 52, a patterned transparent conductive oxide front electrode 54, a continuous thin film 56 of TFS semiconductor, and a patterned zinc oxide back electrode 58. In a preferred embodiment, the transparent conductive oxide front electrode 54 is composed of tin oxide, which may be doped with fluorine, antimony, or other elements. The electrode 58 comprises a plurality of back electrode portions formed of a transparent conductive zinc oxide layer separated by a nonconducting spacing 64 and arranged to substantially overlie elongated photovoltaic regions of the solar cell panel. The front tin oxide electrode 54 has applied to it a series of thickened contact portions or "stitch bars" 60. Tin oxide layer 54 is patterned to form a plurality of transparent electrode portions separated by a spacing 62 and substantially underlying the respective photovoltaic regions. The photovoltaic regions are thus effectively sandwiched between the back electrode portions and the front electrode portions for collection of current generated within the regions. In addition, each front electrode portion partially overlaps the back electrode portion of an adjacent photovoltaic region over a preselected area, the area between spacings 62 and 64.

A major feature of this construction is the provision of conductive paths substantially transversely through the active thin film 56 between each front electrode portion and the back electrode portion of an adjacent photovoltaic region. Inerconnection is accomplished at the area of electrode overlap to connect the photovoltaic regions electrically in series without patterning or otherwise interrupting the film.

In the embodiment illustrated in FIG. 5, the stitch bars 60 are tall enough, in comparison to the TFS layer 56, to cause TFS layer 56 to be distorted in a manner producing relatively thin regions which are unable to withstand the cell voltage. Thus the stitch bars 60 electrically short through the TFS layer 56. Electrical conduction then takes place through the relatively thin regions caused by distortion of the TFS layer 56. It is advantageous that the stitch bars be as rough as possible at their upper surfaces to focus the applied electric field and further reduce the resistance of the relatively thin regions formed in the TFS layer 56 by the stitch bars 60.

The stitch bars 60 are preferably approximately 25 microns thick and the TFS layer 56 is preferably about 3,000 to 9,000 angstroms in thickness. The patterned transparent conductive tin oxide layer 54 is preferably about 3,000 to 10,000 angstroms thick, while the transparent conductive zinc oxide layer 58 is preferably about 2,000 to 15,000 angstroms in thickness. At the locations of the stitch bars 60, TFS layer 56 is sandwiched between a pair of conductive elements and the stitch bars 60 are at least two times thicker than the thickest portion of the TFS layer 56. This produces an effective short circuit in the film in the area of each stitch bar as pointed out above, but does not short out the solar cells themselves because TFS layer 56 has a very high sheet resistance, in the neighborhood of $1 \times 10^8$ (100 million) ohms per square compared to about 1 to 15 ohms per square for the tin oxide and zinc oxide transparent conductive layers. The sheet resistance virtually eliminates current within the plane of the film, leaving only substantially transverse currents developed within the photovoltaic regions which are conducted across the electrodes and pass between them at the areas of overlap.

Although shorting through TFS layer 56 can be achieved in many circumstances with the structure described, it is sometimes desirable to enhance localized conduction through TFS layer 56 by applying heat in the form of laser pulses to the TFS solar cell panel 50. In the case in which the stitch bars 60 are relatively high, narrow and rough, such heat can cause a dispersal of the back electrode material, and possibly the material of the stitch bars 60, into and across the TFS layer 56. The resulting fused region is much more conductive than the bulk of the film and enhances interconnection of the cells. The use of laser pulses assures that the bulk of TFS layer 56 is unaffected by the heat and does not experience diffusion of the back electrode material, while the desired level of intermixing is obtained at the area of overlap, is illustrated in FIG. 5, wherein a laser beam 90 as directed onto the back electrode at the point where the stitch bar 60 causes deformation of back electrode 58.

The process of producing the TFS solar cell panels is generally described above with respect to the make up of the panel except for the stitch bars 60 and the spacings 62 and 64. In a preferred embodiment, the stitch bars 60 are screen printed on tin oxide coated glass and fired. The tin oxide transparent conductive layer is then laser scribed to produce spacings 62. TFS layer 56 is then laid down as described above. Zinc oxide transparent conductive layer 58 is then deposited upon TFS layer 56 after printing with an inorganic maskant, following which the maskant is stripped to produce spacings 64. Alternatively, spacings 64 can be produced by laser scribing or by means of electrochemical etching with a jet. The final step in fabrication of the TFS solar cell panels is the laser fusing illustrated in FIG. 5, which as described above, shorts out the TFS layer 56 in the vicinity of the stitch bar.

Figure 6:
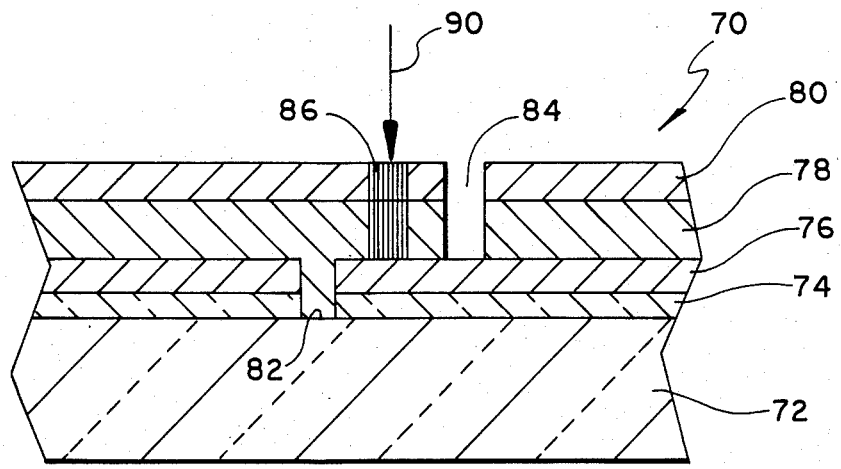
FIG. 6 is an enlarged, fragmentary, cross-sectional schematic view of the CIS solar cell panel illustrated in FIG. 4, showing the construction thereof.

The thin film CIS panel is illustrated in FIG. 6, wherein a glass substrate 72 has deposited thereon a chromium layer 74 and a molybdenum layer 76. A CIS layer is deposited upon molybdenum layer 76 and a transparent conductive zinc oxide layer is deposited upon CIS layer 78. Spacing 82 is provided through molybdenum layer 76 and chromium layer 74 and spacing 84 is provided through zinc oxide layer 80 and CIS layer 78. Fusion area 86 is shown through zinc oxide layer 80 and CIS layer 78. Fusion may be accomplished by means of laser 90, for example.

The process of fabricating a CIS thin film solar cell panel has generally been described above. In a preferred embodiment, chromium layer 74 and molybdenum layer 76 are sputtered upon glass substrate 70, which may for example be 2 millimeter tempered glass. Chromium layer 74 is preferably deposited to a thickness of about 500 angstroms and molybdenum layer 76 is preferably deposited to a thickness of about 2,000 to 20,000 angstroms. Spacing 82 is produced by laser scribing through molybdenum layer 76 and chromium layer 74. CIS layer 78 is produced as described above, namely by sputtering copper and indium and then selenizing to a preferred thickness of about 2,000 to 20,000 angstroms, following which the zinc oxide layer 80 is deposited. As pointed out above, first a high resistivity zinc oxide layer is deposited to a thickness of about 100 to 2,000 angstrom and then a low resistivity zinc oxide layer is deposited to a thickness of about 5,000 to 20,000 angstroms. Spacing 84 is produced by mechanical scribing. Laser beam 90 is then directed at the area between spacings 82 and 84 to fuse and short through the CIS layer 78.

The final step in the production of the thin film solar cell modules of this invention is joining the TFS solar cell panel with the CIS solar cell panel. As shown in FIG. 2, layer of dielectric 29 is used to separate the TFS solar cell panel from the CIS solar cell panel. The dielectric 29 may be air, in which case a suitable frame for holding the TFS thin film solar cell panel and the CIS thin film solar cell panel in the appropriate position with respect to each other may be used. Alternatively, a pottant layer is used, as described above.

The thin film solar cell modules prepared in accordance with the construction and methods of the present invention have been found to be highly efficient. For example, in an embodiment similar to that shown in FIG. 2 the TFS solar cell panel was found to have a current density of 13.2 milliamperes per square centimeter, an open circuit voltage, VOC, of 0.88 volts, a fill factor, FF, of 0.69 and an efficiency of 8.0 percent. The CIS solar cell panel in the thin film solar cell module was found to have a current density of 16.1 milliamperes per square centimeter, an open circuit voltage of 0.41 volts, a fill factor of 0.64, and an efficiency of 4.2 percent. Thus the thin film solar cell module incorporating the two thin film solar cell panels had an efficiency of 12.2 percent.

While certain specific embodiments of the invention have been disclosed as typical, the invention is, of course, not limited to these particular forms but rather is applicable to all such variations as fall within the scope of the intended claims. For example, other configurations of thin film solar panels than those specifically taught herein and other means of connecting the solar cells forming the panels can be utilized. In addition, various series and parallel connections of solar cells incorporated into the thin film solar cell panels can be utilized in the thin film solar cell modules of the present invention.

What is claimed is:

1. A thin film solar cell module comprising a first solar cell panel containing an array of solar cells consisting of a TFS semiconductor sandwiched between a transparent conductive zinc oxide layer and a transparent conductive layer selected from the group consisting of tin oxide, indium tin oxide, and zinc oxide deposited upon a transparent superstrate, and a second solar cell panel containing an array of solar cells consisting of a CIS semiconductor layer sandwiched between a zinc oxide semiconductor layer and a conductive metal layer deposited upon an insulating substrate, said zinc oxide semiconductor layer containing a first relatively thin layer of high resistivity zinc oxide adjacent said CIS semiconductor and a second relatively thick layer of low resistivity zinc oxide overlying said high resistivity zinc oxide layer, said transparent conductive zinc oxide layer of said first panel facing said low resistivity zinc oxide layer of said second panel, said first and second panels being positioned optically in series and separated by a transparent insulating layer.

2. A thin film solar cell module according to claim 1 wherein said TFS semiconductor is a P-I-N type semiconductor.

3. A thin film solar cell module according to claim 1 wherein said TFS semiconductor is a P-I-N-P-I-N type semiconductor stack.

4. A thin film solar cell module according to claim 1 where in said transparent conductive zinc oxide layer of said first solar cell panel is a zinc oxide layer deposited upon said TFS semiconductor by chemical vapor deposition.

5. A thin film solar cell module according to claim 1 wherein said transparent conductive zinc oxide layer of said first solar cell panel has a resistivity in the range of about $10^{-4}$ to $10^{-2}$ ohm-centimeter.

6. A thin film solar cell module according to claim 1 wherein:

said CIS semiconductor layer is deposited upon said conductive metal layer by sputtering copper and indium thereon and selenizing the resulting copper and indium containing layer.

7. A thin film solar cell module according to claim 1 wherein said conductive metal layer contains chromium and molybdenum sub-layers, said chromium sublayer being deposited upon said insulating substrate.

8. A thin film solar cell module according to claim 1 wherein said zinc oxide semiconductor layers of said second solar cell panel are deposited upon said CIS semiconductor by chemical vapor deposition.

9. A thin film solar cell module according to claim 1 wherein said high resistivity zinc oxide layer has a thickness of about 100 to 2,000 angstroms.

10. A thin film solar cell module according to claim 1 wherein said high resistivity zinc oxide layer has a resistivity of about 0.1 to 0.2 ohm-centimeter.

11. A thin film solar cell module according to claim 1 wherein said low resistivity zinc oxide layer has a thickness of about 5,000 to 20,000 angstroms.

12. A thin film solar cell module according to claim 1 wherein said low resistivity zinc oxide layer has a resistivity of about $1\times 10^{-3}$ to $2\times 10^{-3}$ ohm-centimeter.

13. A thin film solar cell module according to claim 1 wherein said transparent insulating layer is air.

14. A thin film solar cell module according to claim 1 wherein said transparent insulating layer comprises a material selected from the group consisting of silicone, polyvinyl butyral, and ethylene vinyl acetate.

* * * * *